United States Patent
Arita et al.

(10) Patent No.: US 9,548,090 B2
(45) Date of Patent: Jan. 17, 2017

(54) ADJUSTMENT METHOD OF SIGNAL LEVEL IN SEMICONDUCTOR DEVICE AND SEMICONDUCTOR DEVICE

(71) Applicant: Socionext Inc., Yokohama-shi, Kanagawa (JP)

(72) Inventors: Morimi Arita, Yokohama (JP); Tomoya Tsuruta, Koganei (JP); Tomoyuki Yamada, Fussa (JP)

(73) Assignee: SOCIONEXT, INC., Yokohama (JP)

( * ) Notice: Subject to any disclaimer, the term of this patent is extended or adjusted under 35 U.S.C. 154(b) by 0 days.

(21) Appl. No.: 14/984,779

(22) Filed: Dec. 30, 2015

(65) Prior Publication Data

US 2016/0225421 A1 Aug. 4, 2016

(30) Foreign Application Priority Data

Jan. 29, 2015 (JP) .................................. 2015-015399

(51) Int. Cl.
    *G11C 5/14* (2006.01)
    *G11C 7/22* (2006.01)

(52) U.S. Cl.
    CPC ............... *G11C 7/222* (2013.01); *G11C 5/148* (2013.01)

(58) Field of Classification Search
    USPC .................................. 365/189.09, 189.11, 154
    See application file for complete search history.

(56) References Cited

U.S. PATENT DOCUMENTS

| 2006/0126412 A1 | 6/2006 | Maki |
| 2008/0174335 A1* | 7/2008 | Maekawa .......... G01R 31/2621 324/762.09 |
| 2008/0253172 A1 | 10/2008 | Yamagami |
| 2009/0067273 A1* | 3/2009 | Koike .................... G11C 11/413 365/203 |
| 2012/0155211 A1 | 6/2012 | Sumitani |
| 2014/0002199 A1 | 1/2014 | Tsuruta |

FOREIGN PATENT DOCUMENTS

| JP | 2008-262637 A | 10/2008 |
| JP | 2010-109115 A | 5/2010 |
| JP | 2010-282704 A | 12/2010 |
| JP | 2011-054255 A | 3/2011 |
| JP | 2014-010874 A | 1/2014 |
| WO | WO 2005/008677 A1 | 1/2005 |

* cited by examiner

*Primary Examiner* — Vu Le

(74) *Attorney, Agent, or Firm* — Arent Fox LLP

(57) ABSTRACT

Characteristics of each transistor in a semiconductor device including a transistor of a memory cell are measured by an ASV monitoring circuit, a power supply voltage supplied to the semiconductor device is determined based on the measured characteristics of the transistor, a data read-out speed of the memory cell under the determined power supply voltage supplied is measured while changing a signal level of a word line by an SRAM word line monitoring circuit, the signal level of the word line is determined by comparing the measured data read-out speed of the memory cell and a specification range of the memory cell, and the signal level of the word line is appropriately set at the power supply voltage applied by the ASV.

7 Claims, 6 Drawing Sheets

| FREQUENCY | Svt | Hvt | SRAM |
|---|---|---|---|
| F1~F2 | VDD1 | VDD1 | VDD1 |
| F2~F3 | VDD2 | VDD1 | VDD2 |
| F3~F4 | VDD2 | VDD2 | VDD2 |
| F4~F5 | VDD3 | VDD3 | VDD3 |
| F5~F6 | VDD3 | VDD3 | VDD4 |
| F6~F7 | VDD4 | VDD4 | VDD4 |

*VDD1<VDD2<VDD3<VDD4

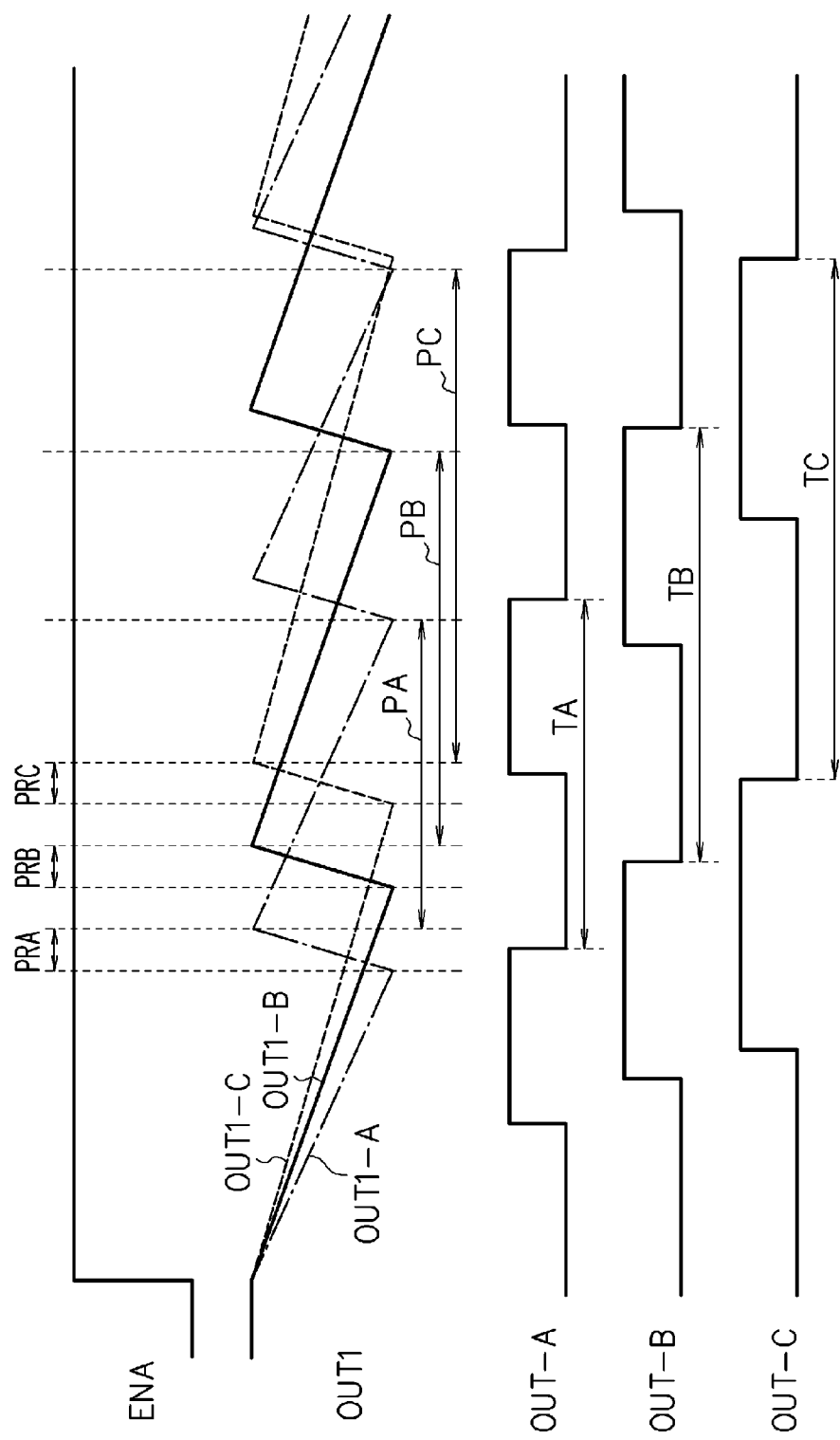

ADJUSTMENT METHOD OF SIGNAL LEVEL IN SEMICONDUCTOR DEVICE AND SEMICONDUCTOR DEVICE

CROSS-REFERENCE TO RELATED APPLICATION

This application is based upon and claims the benefit of priority of the prior Japanese Patent Application No. 2015-015399, filed on Jan. 29, 2015, the entire contents of which are incorporated herein by reference.

FIELD

The embodiments discussed herein are directed to an adjustment method of a signal level in a semiconductor device and a semiconductor device.

BACKGROUND

In a semiconductor device, there is an ASV (adaptive supply voltage) technology in which a power supply voltage is changed in accordance with process conditions (for example, element characteristics of transistors or the like formed in a chip). The ASV technology is applied, and for example, the power supply voltage applied to a semiconductor device (chip) whose transistor is finished to be a fast side (a transistor which is finished to have a low threshold value) is lowered to thereby lower an operating power by suppressing a leak current, then it becomes possible to suppress power consumption equal to or lower than a semiconductor device whose transistor is finished to be a slow side (a transistor which is finished to have a high threshold value).

In a semiconductor device including an SRAM macro, there is one including a read assist function enabling stability at a data read-out time by lowering a signal level which is in high level at a word line in a plurality of stages (for example, refer to Patent Documents 1 to 3). As for an SRAM cell transistor in a semiconductor device, an art in which the element characteristics thereof are measured by a ring oscillator formed in the semiconductor device has been proposed (for example, refer to Patent Documents 4, 5). An art measuring AC characteristics of a memory macro in a semiconductor device has been proposed (for example, refer to Patent Document 6).

[Patent Document 1] Japanese Laid-open Patent Publication No. 2008-262637

[Patent Document 2] Japanese Laid-open Patent Publication No. 2011-54255

[Patent Document 3] Japanese Laid-open Patent Publication No. 2010-282704

[Patent Document 4] Japanese Laid-open Patent Publication No. 2010-109115

[Patent Document 5] Japanese Laid-open Patent Publication No. 2014-10874

[Patent Document 6] International Publication Pamphlet No. WO 2005/008677

When the ASV technology is applied for a semiconductor device including a plurality of kinds of transistors, the power supply voltage is determined according to a transistor which is at the slowest side in the semiconductor device so that an operating specification is satisfied by all of circuits. For example, when there is an SRAM cell transistor in the semiconductor device, the transistor of the SRAM cell is finished to be fast, and one or more transistors of other peripheral circuits are finished to be slow, high power supply voltage is supplied according to the transistors of the peripheral circuits, and the power supply voltage does not become one which is suited to the SRAM cell transistor.

In this case, a voltage which is higher than a supposed power supply voltage when the transistor is finished to be fast is applied to the SRAM cell transistor, and therefore, there is allowance in read characteristics and write characteristics, but a read-out speed becomes excessively fast. Conventionally, it has been necessary to set a specification of an SRAM macro with a large margin considering the situation as stated above and to perform a timing verification of the semiconductor device.

SUMMARY

In an aspect of an adjustment method of a signal level in a semiconductor device, an inspection device measures characteristics of each transistor in the semiconductor device including a transistor of a memory cell by using a first monitoring circuit, determines a power supply voltage supplied to the semiconductor device based on the measured characteristics of the transistors, measures a data read-out speed of the memory cell under the determined power supply voltage supplied by using a second monitoring circuit while changing the signal level of the word line, compares the measured data read-out speed of the memory cell and a specification range of the memory cell being found in advance, and determines the signal level of the word line in accordance with a comparison result.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 8 is a view illustrating output waveform examples of the SRAM word line monitoring circuit in the embodiment.

DESCRIPTION OF EMBODIMENTS

Hereinafter, embodiments will be explained with reference to accompanying drawings.

Figure 1:
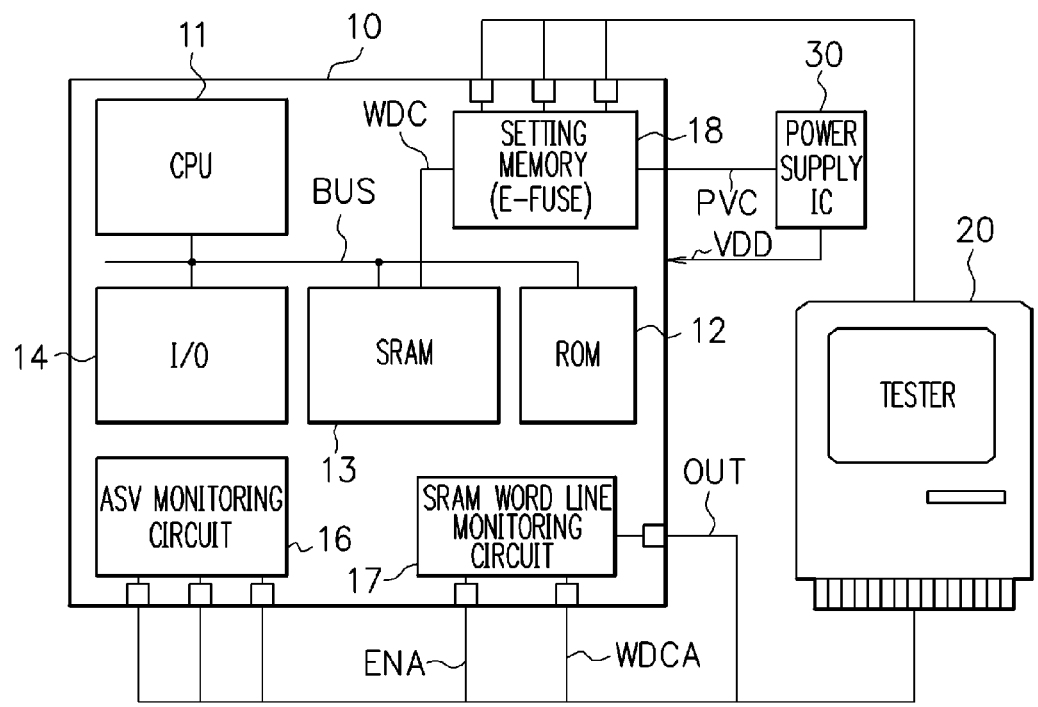
FIG. 1 is a view illustrating a configuration example relating to controls of a power supply voltage and a signal level in a semiconductor device according to an embodiment.

FIG. 1 is a view illustrating a configuration example relating to controls of a power supply voltage and a signal level in a semiconductor device according to an embodiment. In FIG. 1, a semiconductor device 10 is a device whose power supply voltage and signal level are controlled, a tester (inspection device) 20 performs various tests of the semiconductor device 10, and a power supply IC (power supply circuit) 30 generates the power supply voltage to be supplied to the semiconductor device 10. The controls of the power supply voltage and the signal level in the semiconductor device 10 are performed in accordance with characteristics of elements (transistors) in the semiconductor device 10 which are obtained by the tests performed by the tester (inspection device) 20. When the various tests of the semiconductor device 10 are performed by the tester (inspection device) 20, the power supply voltage may be supplied from the tester (inspection device) 20 to the semiconductor device 10.

The semiconductor device 10 includes, for example, a CPU (central processing unit) 11, a ROM (read only memory) 12, an SRAM (static random access memory) macro 13, an I/O (input/output) circuit 14, an ASV (adaptive supply voltage) monitoring circuit 16, an SRAM word line monitoring circuit 17, and a setting memory 18. The CPU 11, the ROM 12, the SRAM macro 13, and the I/O circuit 14 are communicably connected with each other via a bus BUS.

The CPU 11 executes certain processes and controls each functional unit in the semiconductor device 10 by reading out and executing programs stored in the ROM 12 or the like. For example, the CPU 11 executes the process in accordance with the program, and exchanges data with the SRAM macro 13, the I/O circuit 14, and so on via the bus BUS in accordance with the process. The SRAM macro 13 functions as a main memory, a work area, or the like of the CPU 11.

The ASV monitoring circuit 16 is a monitoring circuit to measure the characteristics of the elements (transistors) in the semiconductor device 10 to determine the power supply voltage which is supplied to the semiconductor device (chip) 10. The ASV monitoring circuit 16 includes, for example, a ring oscillator in which one NAND circuit (negative logical product operation circuit) 201 and (2n) pieces, "n" being a natural number, of inverters 202 are connected in a ring state (annularly) as illustrated in FIG. 2 as a monitoring circuit to measure the element characteristics.

An enable signal ENB which is supplied from the tester 20 and an output of the serially connected inverters 202 (an output of the inverter 202 at a final stage) are input to the NAND circuit 201. An output of the NAND circuit 201 is input to the serially connected inverters 202 (the inverter 202 at a foremost stage). The ring oscillator illustrated in FIG. 2 stops an oscillation operation when the enable signal ENB is "0" (zero), and performs the oscillation operation when the enable signal ENB is "1" to output an oscillation signal.

When there are a plurality of kinds of elements (transistors) in the semiconductor device 10, the ASV monitoring circuit 16 includes the monitoring circuits (ring oscillators) by kinds. Namely, for example, when a plurality of kinds of transistors whose threshold voltages are different from one another are used in the semiconductor device 10, the monitoring circuits which are able to measure respective characteristics are mounted. When three kinds of transistors of a transistor with a standard threshold voltage (Svt transistor), a transistor with a higher threshold voltage to suppress a leak current (Hvt transistor), and a transistor of an SRAM cell (SRAM transistor) are included, the monitoring circuits such as the ring oscillators using these elements are mounted.

Figure 2:
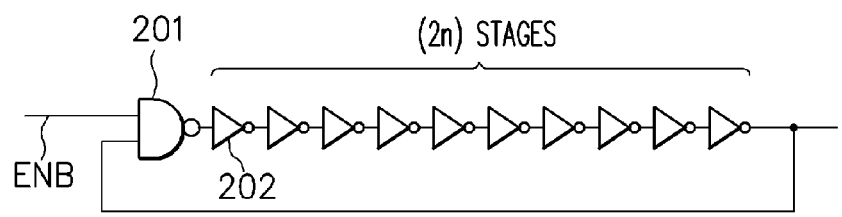
FIG. 2 is a view illustrating a configuration example of a ring oscillator in the embodiment.

Note that the ring oscillator illustrated in FIG. 2 is an example, and it is not limited thereto. As illustrated in FIG. 3 and FIG. 21 in the Patent Document 4 (Japanese Laid-open Patent Publication No. 2010-109115), for example, a configuration ratio of PMOS transistors and NMOS transistors in the inverter 202 is changed to thereby obtain the characteristics of each of the PMOS transistor and the NMOS transistor.

The SRAM word line monitoring circuit 17 is a monitoring circuit to measure the data read-out speed when the signal level of the word line is changed at the SRAM cell in the semiconductor device 10. In the embodiment, the SRAM word line monitoring circuit 17 measures the data read-out speed when the signal level in high-level at the word line of the SRAM cell is lowered. The SRAM word line monitoring circuit 17 is controlled by an enable signal ENA and a word line level control signal WDCA from the tester 20, and outputs an output signal OUT to the tester 20. An internal configuration of the SRAM word line monitoring circuit 17 is described later.

The setting memory 18 stores information (code) indicating the determined power supply voltage which is supplied to the semiconductor device 10 and the determined signal level of the word line of the SRAM cell. The setting memory 18 is an electrical fuse which is set to be a disconnected state or a non-disconnected state in accordance with, for example, the set information (code). A voltage control signal PVC in accordance with power supply voltage information (power supply voltage code) which is set at the setting memory 18 is output to the power supply IC 30 or the like, and thereby, a power supply voltage VDD which is in accordance with the setting is supplied to the semiconductor device 10. A word line level control signal WDC in accordance with signal level information which is set at the setting memory 18 is output to the SRAM macro 13, and thereby, the signal level in high-level of the word line is controlled in the SRAM macro 13.

Figure 3A:
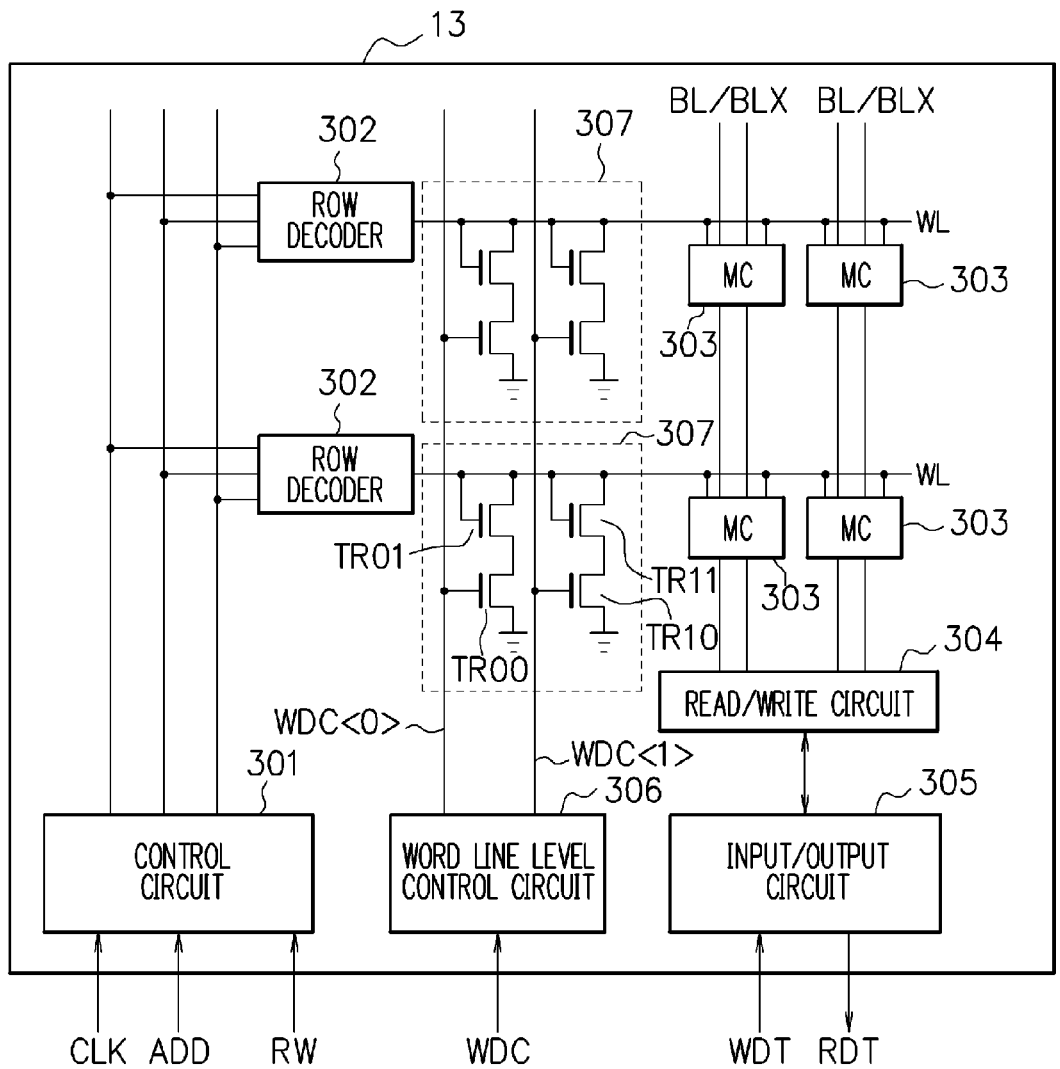
FIG. 3A is a view illustrating a configuration example of an SRAM macro in the embodiment.

FIG. 3A is a view illustrating a configuration example of the SRAM macro 13 in the embodiment. In FIG. 3A, four (for two rows, two columns) memory cells are illustrated for convenience of description, but the SRAM macro 13 includes much more word lines WL and bit line pairs BL, BLX. In the SRAM macro 13, a memory cell is provided at an intersection part between one word line WL and one bit line pair BL, BLX.

As illustrated in FIG. 3A, the SRAM macro 13 includes a control circuit 301, row decoders 302, memory cells 303, a read/write circuit 304, an input/output circuit 305, a word line level control circuit 306, and pulldown circuits 307. A clock signal CLK, an address signal ADD, a read/write signal RW, and so on are input to the control circuit 301 from outside the SRAM macro 13, and the control circuit 301 outputs a control signal which is obtained by decoding the input signals to the row decoders 302. The row decoder 302 drive-controls the word line WL where the memory cell 303 is connected in accordance with the control signal input from the control circuit 301.

Figure 3B:
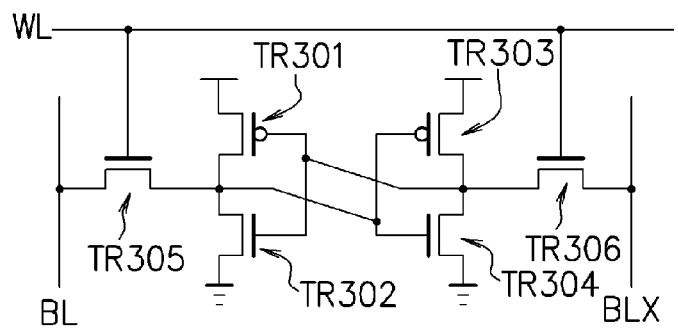
FIG. 3B is a view illustrating a configuration example of a memory cell in the embodiment.

The memory cell 303 includes, for example, PMOS transistors TR301, TR303 as load transistors, NMOS transistors TR302, TR304 as drive transistors, and PMOS transistors TR305, TR306 as access transistors as illustrated in FIG. 3B. The PMOS transistor TR301 and the NMOS transistor TR302 are serially connected to make up an inverter, the PMOS transistor TR303 and the NMOS transistor TR304 are serially connected to make up an inverter.

An input and an output of each inverter are cross-connected to make up a flip-flop, and this flip-flop enables retention of data. Gates of the NMOS transistors TR305, TR306 are connected to the word line WL, sources of these transistors are respectively connected to the bit line BL, an inversion bit line BLX, and drains of these transistors are connected to outputs of the respective inverters.

A data write to the memory cell 303 is enabled by setting the word line WL in high-level, and changing one of electric potentials of the bit line BL or the inversion bit line BLX which is precharged into high-level in advance from high-level to low-level. A data read-out from the memory cell 303 is enabled by precharging the bit line BL, and the inversion bit line BLX to high-level in advance, and setting the word line WL in high-level. One of the electric potentials of either the bit line BL or the inversion bit line BLX is changed from high-level to low-level in accordance with the state which is retained by the flip-flop in the memory cell.

The read/write circuit 304 drives the bit line BL, the inversion bit line BLX in accordance with a write data WDT input to the input/output circuit 305 at the data write time to the memory cell 303. The read/write circuit 304 senses the electric potentials of the bit line BL, the inversion bit line BLX at the data read-out time from the memory cell 303, and outputs the sensed data as a read-out data RDT via the input/output circuit 305.

The word line level control circuit 306 outputs word line level control signals WDC<0>, WDC<1> to the pulldown circuit 307 which is connected to each word line WL in accordance with the word line level control signal WDC output from the setting memory 18. The pulldown circuit 307 includes four NMOS transistors TR00, TR01, TR10 and TR11.

A drain and a source of the transistor TR01 are connected to the word line WL, and the source of the transistor TR01 is connected to a reference potential (ground level) via the transistor TR00 where the word line level control signal WDC<0> is connected to a gate thereof. A drain and a source of the transistor TR11 are connected to the word line WL, and the source of the transistor TR11 is connected to the reference potential (ground level) via the transistor TR10 where the word line level control signal WDC<1> is connected to a gate thereof.

The transistors TR00, TR10 of the pulldown circuit 307 are on/off controlled by the word line level control signals WDC<0>, WDC<1>, and thereby, the word line WL is connected to the reference potential (ground level) via the transistors TR00, TR10 which are turned into on-states to be pulled down, and thereby, the signal level in high-level at the word line WL is controlled. Note that characteristics of a pair of the transistors TR00, TR01 and a pair of the transistors TR10, TR11 may be the same (for example, a resistance value may be the same) or different. When the characteristics of the pair of the transistors TR00, TR01 and the pair of the transistors TR10, TR11 are made different, it becomes possible to finely control the signal level in high-level at the word line WL (for example, it is possible to control into different four states by using the word line level control signals WDC<0>, WDC<1>).

Figure 4:
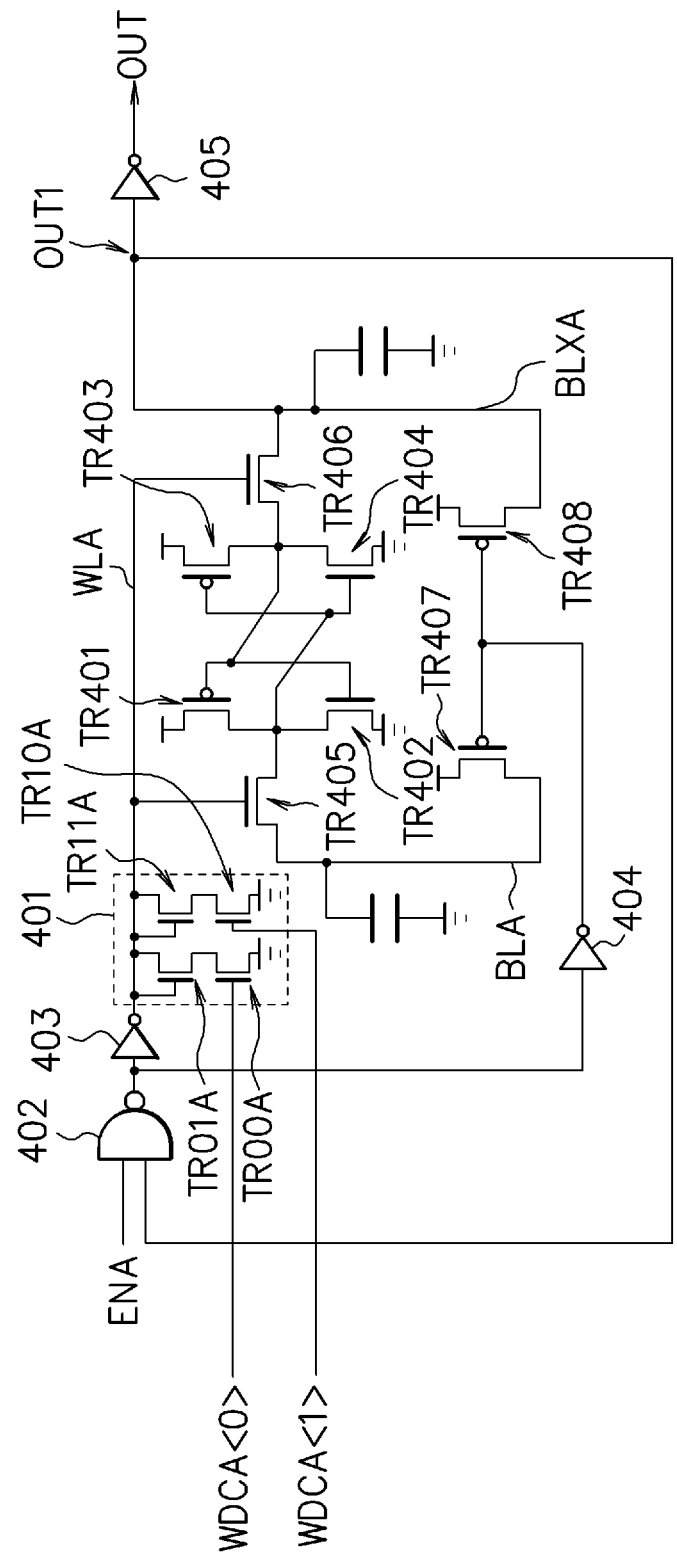
FIG. 4 is a view illustrating a configuration example of an SRAM word line monitoring circuit in the embodiment.

FIG. 4 is a view illustrating a configuration example of the SRAM word line monitoring circuit 17 in the embodiment. The SRAM word line monitoring circuit 17 includes a pulldown circuit 401, an NAND circuit 402, inverters 403, 404, 405, PMOS transistors TR401, TR403, TR407 and TR408, and NMOS transistors TR402, TR404, TR405 and TR406.

The pulldown circuit 401 includes four NMOS transistors TR00A, TR00A, TR10A and TR11A. The transistors TR00A, TR00A, TR10A and TR11A of the pulldown circuit 401 have similar characteristics as the transistors TR00, TR01, TR10 and TR11 of the pulldown circuit 307 illustrated in FIG. 3A. A drain and a source of the transistor TR00A are connected to a word line WLA, and the source of the transistor TR00A is connected to the reference potential (ground level) via the transistor TR00A where a word line level control signal WDCA<0> is connected to a gate thereof. A drain and a source of the transistor TR11A are connected to the word line WLA, and the source of the transistor TR11A is connected to the reference potential (ground level) via the transistor TR10A where a word line level control signal WDCA<1> is connected to a gate thereof.

Similar to the pulldown circuit 307, the transistors TR00A, TR10A of the pulldown circuit 401 are on/off controlled by the word line level control signals WDCA<0>, WDCA<1>, and thereby, the word line WLA is connected to the reference potential (ground level) via the transistors TR00A, TR10A which are turned into on-states to be pulled down, and thereby, the signal level in high-level at the word line WLA is controlled.

The PMOS transistors TR401, TR403, and the NMOS transistors TR402, TR404, TR405 and TR406 make up a memory cell as same as the PMOS transistors TR301, TR303, and the NMOS transistors TR302, TR304, TR305 and TR306 illustrated in FIG. 3B. Namely, the PMOS transistor TR401 as the load transistor and the NMOS transistor TR402 as the drive transistor are serially connected to make up an inverter. The PMOS transistor TR403 as the load transistor and the NMOS transistor TR404 as the drive transistor are serially connected to make up an inverter. An input and an output of each inverter are cross-connected to make up a flip-flop.

Gates of the NMOS transistors TR405, TR406 as access transistors are connected to the word line WLA, sources of these transistors are respectively connected to a bit line BLA, an inversion bit line BLXA, and drains of these transistors are connected to the outputs of respective inverters. The bit line BLA, the inversion bit line BLXA are connected to the power supply voltage (high-level) via the precharge transistors TR407, TR408, respectively. Note that in FIG. 4, capacitive components held by the bit line BLA, the inversion bit line BLXA are schematically illustrated.

The enable signal ENA from the tester 20 and an electric potential of a node OUT1 are input to the NAND circuit 402. An output of the NAND circuit 402 is connected to the word line WLA via the inverter 403, and is connected to gates of the precharge transistors TR407, TR408 via the inverter 404. The node OUT1 is an output node where the inversion bit line BLXA is connected. The electric potential of the node OUT1 is output as an output signal OUT via the inverter 405.

The SRAM word line monitoring circuit 17 illustrated in FIG. 4 operates as a monitoring circuit when the enable signal ENA from the tester 20 is "1", and stops the operation when the enable signal ENA is "0" (zero). When the enable signal ENA is "0" (zero), the precharge transistors TR407, TR408 are turned on, the electric potentials of the bit line BLA, the inversion bit line BLXA are in high-level (power supply voltage level), and the electric potential of the node OUT1 is also in high-level.

When the enable signal ENA changes from "0" (zero) to "1", the output of the NAND circuit 402 becomes low-level, the precharge transistors TR407, TR408 are turned off, and the word line WLA becomes high-level. At this time, electric charges accumulated on the bit line BLA, the inversion bit line BLXA are pulled out by the memory cell (SRAM cell), and the electric potentials of the bit line BLA, the inversion bit line BLXA are lowered.

After that, when the electric potentials of the bit line BLA, the inversion bit line BLXA are below an electric potential which is judged to be low-level, the output of the NAND circuit 402 becomes high-level, the precharge transistors TR407, TR408 are turned on, and the word line WLA becomes low-level. The electric potentials of the bit line BLA, the inversion bit line BLXA thereby become high-level (power supply voltage level), and the electric potential of the node OUT1 becomes high-level.

After that, this operation is repeated, and the SRAM word line monitoring circuit 17 outputs the oscillation signal as the output signal OUT during a period when the enable signal ENA is "1". Here, a period of time required for the precharge transistors TR407, TR408 to be turned off, the word line WLA to be high-level, the electric charges accumulated on the bit line BLA and the inversion bit line BLXA to be pulled out by the memory cell (SRAM cell) is in proportion to the data read-out time from the memory cell (SRAM cell). This time becomes long as the signal level in high-level at the word line WLA is lowered, and this characteristic can be measured by an oscillation frequency of the output signal OUT from the SRAM word line monitoring circuit 17. Namely, it becomes possible to measure the data read-out time from the memory cell (SRAM cell) by the oscillation frequency of the output signal OUT from the SRAM word line monitoring circuit 17.

Figure 5:
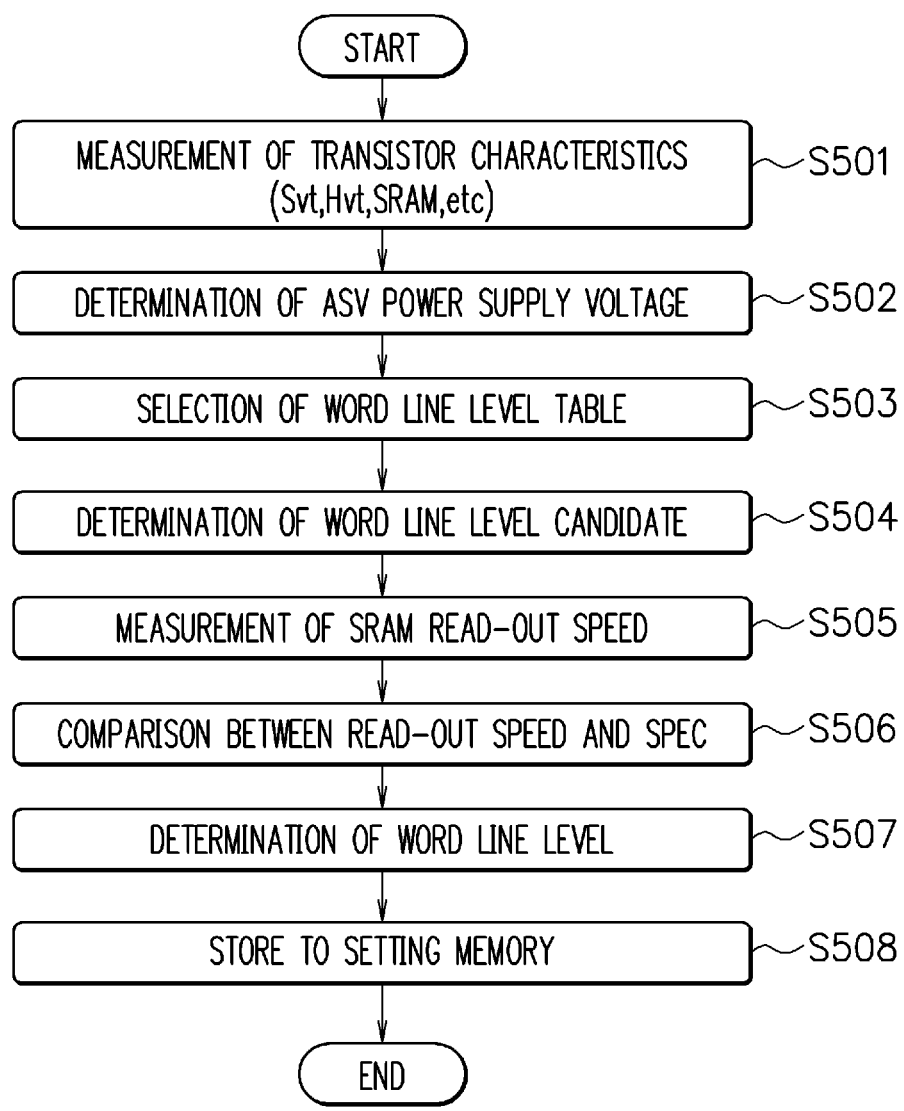
FIG. 5 is a flowchart illustrating an example of control operations of the power supply voltage and the signal level in the semiconductor device in the embodiment.

Control operations of the power supply voltage and the signal level in the semiconductor device in the embodiment are described. FIG. 5 is a flowchart illustrating an example of the control operations of the power supply voltage and the signal level in the semiconductor device in the embodiment. The operations illustrated in FIG. 5 are executed in accordance with the control by the tester 20, and selection and determination in each process are performed by the tester 20.

At first, at step S501, the power supply voltage defined in advance by the tester 20 is supplied to the semiconductor device (chip) 10, and the characteristics of the elements (transistors) in the semiconductor device 10 are measured by using the ASV monitoring circuit 16 to determine the power supply voltage which is supplied to the semiconductor device 10. Here, it is assumed that three kinds of transistors of the transistor with the standard threshold voltage (Svt transistor), the transistor whose threshold voltage is made high to suppress the leak current (Hvt transistor), and the transistor of the SRAM cell (SRAM transistor) are included in the semiconductor device 10.

Figures 6, 7:
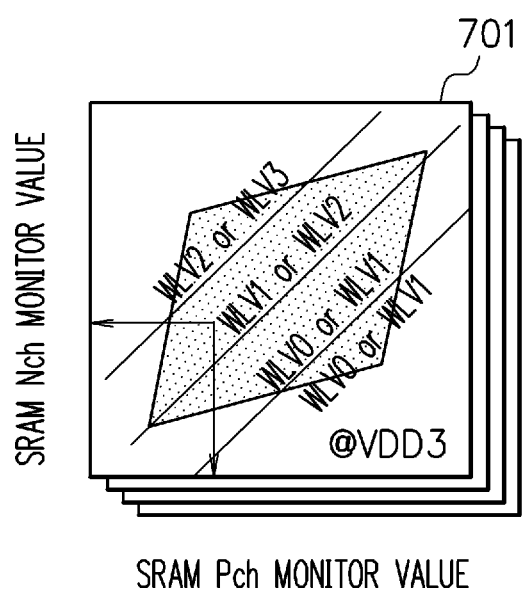
FIG. 6 is a view illustrating an example of a relationship between element characteristics and the power supply voltages in the embodiment.
FIG. 7 is a view illustrating an example of a relationship between the element characteristics and word line levels in the embodiment.

Next, at step S502, the power supply voltage supplied to the semiconductor device 10 is determined from a corresponding table illustrating a relationship between the element characteristics (for example, the oscillation frequency of the ring oscillator) and the power supply voltage created in advance and stored in the tester 20. For example, a corresponding table whose example is illustrated in FIG. 6 is created, and the power supply voltage supplied to the semiconductor device 10 is determined based on the element characteristics of the three kinds of transistors of the Svt transistor, the Hvt transistor and the SRAM transistor which are obtained by the measurements. For example, when a measurement frequency of the Svt transistor is F4 to F5, a measurement frequency of the Hvt transistor is F4 to F5, and a measurement frequency of the SRAM transistor is F3 to F4, a voltage VDD3 which is the highest among them is determined to be the power supply voltage. Information (code) representing the determined power supply voltage is stored at the setting memory 18.

At step S503, a table corresponding to the determined power supply voltage is selected from among relational tables between the element characteristics of the SRAM transistor and word line level candidates which are found in advance by each power supply voltage (power supply voltage code) by the ASV as illustrated in FIG. 7. In FIG. 7, a part surrounded by a center square represents a tolerance range of transistor variation, and a transistor which is out of this region is determined to be defective. Note that the relationship between the element characteristics of the SRAM transistor and the word line level candidates is found in advance by TEG or simulation. For example, yield of an SRAM macro is measured (simulated) while changing the word line level and the power supply voltage, and the word line levels which satisfy the required yield are made into a table as the candidates. The relational table between the element characteristics of the SRAM transistor and the word line level candidates is exemplified, but a data format is arbitrary and may be a mode other than the table as long as the relationship between the element characteristics of the SRAM transistor and the word line level candidates can be defined.

At step S504, the element characteristics of the SRAM transistor measured at the step S501 are applied to the table selected at the step S503 to determine the candidate of the word line level. For example, in the selected table, a point where a horizontal axis value is a monitor value (a measurement frequency when the monitoring circuit is the ring oscillator) of a pch transistor which makes up the SRAM cell measured at the step S501, and a vertical axis value is a monitor value of an nch transistor which makes up the SRAM cell measured at the step S501 is found, and the word line level which is applicable to the point is set to be the candidate of the signal level.

At step S505, the SRAM word line monitoring circuit 17 is operated while setting the signal level selected as the candidate at the step S504 as the word line level, and the data read-out speed at the SRAM cell is measured. At this time, the information of the power supply voltage (corresponding to the signal PVC) is read-out from the setting memory 18 by the tester 20, and the power supply voltage determined at the step S502 is supplied to the semiconductor device 10.

As stated above, the SRAM word line monitoring circuit 17 controls the pulldown circuit 401 by the word line level control signal WDCA from the tester 20 as same as the SRAM macro 13, and thereby, it is possible to lower the signal level of the word line WLA from the voltage VDD in a plurality of stages. The precharge transistors TR407, TR408 are set to be enough larger than the SRAM cell transistors TR401 to TR406, and thereby, as stated above, the output signal OUT of the SRAM word line monitoring circuit 17 generally oscillates at a frequency in accordance with the data read-out speed of the SRAM. The read-out speed becomes slow by lowering the signal level of the word line WLA, then the oscillation is performed at a slow frequency by that amount.

FIG. 8 is a view illustrating a waveform example of the output signal OUT of the SRAM word line monitoring circuit 17 when the signal level of the word line WLA is changed. In FIG. 8, OUT1 represents the electric potential of the node OUT1, and OUTs represent output signals from the SRAM word line monitoring circuit 17. One with a subscript A is a waveform when the signal level of the word line WLA is higher than one with a subscript B, and one with a subscript C is a waveform when the signal level of the word line WLA is lower than one with the subscript B. Namely, cycles of PA, PB, PC of the node OUT1 and cycles TA, TB, TC of the output signal OUT become longer in a sequence of the subscripts A, B, C. In FIG. 8, PRA, PRB, PRC each represent a precharge period.

Next, at step S506, the oscillation frequency of the output signal OUT of the SRAM word line monitoring circuit 17, in other words, the data read-out speed of the SRAM and a specification range of the SRAM macro found in advance are compared. This specification range is calculated by performing the simulation of the SRAM word line monitoring circuit 17 under timing corner (worst=latest, best=fastest) conditions similar to ones when the specification of the SRAM macro 13 is found.

At step S507, the word line level is determined from the comparison result at the step S506. Namely, the word line level in which the oscillation frequency (the data read-out speed of the SRAM) of the output signal OUT of the SRAM word line monitoring circuit 17 falls within the specification range is selected based on the comparison result. When there are a plurality of word line levels which fall within the specification range, a lower word line level is determined when, for example, stability of the cell is attached a high value.

At step S508, the word line level which is determined at the step S507 is stored at the setting memory 18. The word line level control signal WDC in accordance with the setting of the word line level stored at the setting memory 18 is thereby supplied to the SRAM macro 13, and the signal level in high-level at the word line WL is controlled in a normal operation.

According to the present embodiment, at the power supply voltage applied by the ASV, it is possible to appropriately control the signal level of the word line in accordance with the supplied power supply voltage, and to prevent that the stability of the SRAM cell and the timing specification are deteriorated. For example, in a timing verification of the semiconductor device, it is possible to make a difference between the fastest timing and the latest timing in the data read-out from the SRAM macro small. Therefore, it becomes easy to enable timing met in the semiconductor device, and it is possible to reduce a design man-hour. Besides, it is also possible to reduce the number of buffers and so on to be inserted to enable the timing met, and it becomes possible to reduce a circuit area and to enable low power consumption.

Incidentally, the above-described embodiments are to be considered in all respects as illustrative and no restrictive. Namely, the present invention may be embodied in other specific forms without departing from the spirit or essential characteristics thereof.

In a semiconductor device including a plurality of kinds of transistors including an SRAM cell transistor, a signal level of a word line is determined based on a result measuring a data read-out speed at a memory cell while changing the signal level of the word line at a power supply voltage applied by an ASV, and thereby, it is possible to enable a proper driving of the memory cell, and to appropriately control a specification range of the memory cell.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An adjustment method of a signal level in a semiconductor device including a memory macro with a function switching the signal level of a word line, the adjustment method of the signal level comprising:

measuring, by an inspection device configured to adjust the signal level in the semiconductor device, characteristics of each transistor in the semiconductor device including a transistor of a memory cell by using a first monitoring circuit, the memory cell being disposed at an intersection part between the word line and a bit line in the memory macro, and the first monitoring circuit including measurement circuits by kinds of transistors in the semiconductor device;

determining, by the inspection device, a power supply voltage being supplied to the semiconductor device based on the measured characteristics of the transistor;

measuring, by the inspection device, a data read-out speed of the memory cell, under the determined power supply voltage supplied, while changing the signal level of the word line by using a second monitoring circuit including the memory cell;

comparing, by the inspection device, the measured data read-out speed of the memory cell and a specification range of the memory cell being found in advance; and determining, by the inspection device, the signal level of the word line in accordance with a comparison result in the comparing.

2. The adjustment method of the signal level in the semiconductor device according to claim 1, wherein the measuring the data read-out speed at the memory cell under the determined power supply voltage supplied is performed while switching the signal level of the word line in accordance with candidates of the signal level of the word line being found in accordance with the characteristics of the transistor of the memory cell by selectable power supply voltages.

3. The adjustment method of the signal level in the semiconductor device according to claim 1, wherein the measuring the data read-out speed at the memory cell under the determined power supply voltage supplied, the measuring including:

selecting, by the inspection device, a table corresponding to the determined power supply voltage from tables illustrating candidates of the signal level of the word line in accordance with the characteristics of the transistor of the memory cell being found by selectable power supply voltages;

determining, by the inspection device, the candidate of the signal level of the word line in accordance with the measured characteristics of the transistor of the memory cell based on the selected table;

switching, by the inspection device, the signal level of the word line to the determined candidate of the signal level; and measuring, by the inspection device, the data read-out speed at the memory cell under the determined power supply voltage supplied.

4. The adjustment method of the signal level in the semiconductor device according to claim 1, wherein the measuring the data read-out speed at the memory cell under the determined power supply voltage supplied is performed while switching the signal level of the word line to be the power supply voltage or less in a plurality of stages.

5. The adjustment method of the signal level in the semiconductor device according to claim 1,
wherein in the measuring the data read-out speed at the memory cell under the determined power supply voltage supplied, the signal level of the word line is switched by controlling a pulldown circuit being connected to the word line in accordance with the measured characteristics of the transistor of the memory cell.

6. A semiconductor device being changeable power supply voltage in accordance with characteristics of transistors in the semiconductor device, the semiconductor device comprising:
a memory macro including a first memory cell disposed at an intersection part between a word line and a bit line, and a first pulldown circuit connected to the word line; and
a monitoring circuit including a second memory cell and a second pulldown circuit respectively having the same circuitries with the first memory cell and the first pulldown circuit of the memory macro, and configured to output an oscillation signal at a frequency in accordance with a signal level of the word line being connected the second memory cell.

7. A semiconductor device, comprising:
a memory macro including a first memory cell disposed at an intersection part between a word line and a bit line, and a first pulldown circuit connected to the word line;
a first monitoring circuit including measurement circuits by kinds of transistors to measure characteristics of each transistor in the semiconductor device including the transistor of the first memory cell; and
a second monitoring circuit including a second memory cell and a second pulldown circuit respectively having the same circuitries with the first memory cell and the first pulldown circuit of the memory macro, and configured to output an oscillation signal at a frequency in accordance with a signal level of the word line being connected the second memory cell,
wherein a control is performed to be a power supply voltage determined based on a measurement result at the first monitoring circuit, and the signal level of the word line of the memory macro is controlled based on the output of the second monitoring circuit at the determined power supply voltage.

* * * * *